(12) United States Patent
Nissani (Nissensohn)

(10) Patent No.: US 8,307,184 B1
(45) Date of Patent: Nov. 6, 2012

(54) COMMUNICATION AND MEMORY CAPACITY ENHANCEMENT METHOD AND APPARATUS

(76) Inventor: Daniel Nathan Nissani (Nissensohn), Tel Aviv (IL)

( * ) Notice: Subject to any disclaimer, the term of this patent is extended or adjusted under 35 U.S.C. 154(b) by 180 days.

(21) Appl. No.: 12/806,065

(22) Filed: Aug. 5, 2010

Related U.S. Application Data

(63) Continuation of application No. 12/455,287, filed on Jun. 1, 2009, now abandoned.

(51) Int. Cl.
*G06F 12/00* (2006.01)

(52) U.S. Cl. ................................. 711/170; 711/E12.003

(58) Field of Classification Search ........................ None
See application file for complete search history.

(56) References Cited

U.S. PATENT DOCUMENTS

| | | | | |
|---|---|---|---|---|
| 5,388,220 | A * | 2/1995 | Okabayashi | 711/154 |
| 5,987,487 | A * | 11/1999 | Welland | 708/491 |
| 6,469,931 | B1 | 10/2002 | Ban et al. | |
| 7,027,597 | B1 * | 4/2006 | Stojancic et al. | 380/28 |
| 7,027,598 | B1 * | 4/2006 | Stojancic et al. | 380/28 |
| 7,036,071 | B2 * | 4/2006 | Shany et al. | 714/810 |
| 7,202,816 | B2 * | 4/2007 | Krumm et al. | 342/451 |
| 7,254,679 | B2 * | 8/2007 | Richter et al. | 711/147 |
| 7,319,877 | B2 * | 1/2008 | Krumm et al. | 455/456.3 |
| 7,346,886 | B2 * | 3/2008 | Fukagawa et al. | 716/50 |
| 2007/0040710 | A1 * | 2/2007 | Tomic | 341/50 |

OTHER PUBLICATIONS

Sloane, N.J.A., "Tables of Sphere Packings and Spherical Codes", IEEE Transactions on Information, May 1981, pp. 327-338, http://ieeexplore.ieee.org/stamp/stamp.jsp?arnumber=01056351.*

Sloane, N.J.A., "The Sphere Packing Problem", Documenta Methematica (Extra Volume), 1998, pp. 1-10, http://arxiv.org/pdf/math/0207256v1.pdf.*

J.H. Conway et al., "Fast Quantizing and Decoding Algorithms for Lattice Quantizers and Codes", IEEE Transactions on Information Theory, vol. IT-28, No. 2, Mar. 1982, pp. 227-323, http://ieeexplore.ieee.org/stamp/stamp.jsp?arnumber=01056484.*

John H. Conway et al., "Soft Decoding Techniques for Codes and Lattices, Including The Goley COde and the Leech Lattice", IEEE Transactions on Information Theory, vol. IT-32, No. 1, Jan. 1986, pp. 41-50, http://ieeexplore.ieee.org/stamp/stamp.jsp?tp=&arnumber=1057135.*

Conway et al. "Sphere Packings, Lattices and Groups", Springer Verlag, 3rd Ed., 112 P., Sep. 16, 1998.

Conway et al. "Fast Quantizing and Decoding Algorithms for Lattice Quantizers and Codes", IEEE Transactions on Information Theory, IT-28(2): 227-232, Mar. 1982.

Conway et al. "Soft Decoding Techniques for Codes and Lattices, Including the Golay Code and the Leech Lattice", IEEE Transactions on Information Theory, IT-32(1): 41-50, Jan. 1986.

Sloane "Tables of Sphere Packings and Spherical Codes", IEEE Transactions on Information Theory, IT-27(3): 327-338, May 1981.

Sloane "The Sphere Packing Problem", Documenta Mathematica Extra Volume ICM, p. 1-10, 1998.

* cited by examiner

*Primary Examiner* — Edward Dudek, Jr.
*Assistant Examiner* — Christopher Birkhimer

(57) ABSTRACT

A method and corresponding apparatus for enhancing the capacity of communication and memory devices, said method comprising the representation of information by lattice points confined to a cubic region of an n-dimensional space, by means of which for example capacity gains of 50% or 100% and more may be achieved, relative to 'conventional' communication and storage methods.

29 Claims, 5 Drawing Sheets

COMMUNICATION AND MEMORY CAPACITY ENHANCEMENT METHOD AND APPARATUS

CROSS REFERENCE TO RELATED APPLICATIONS

This application is a continuation of a US patent application entitled "Method and Apparatus for Capacity Increase in Memory Devices" by Daniel N. Nissani (Nissensohn), application Ser. No. 12/455,287, filed on Jun. 1, 2009, now abandoned which application is incorporated herein in its entirety by this reference.

STATEMENT REGARDING FEDERALLY SPONSORED RESEARCH OR DEVELOPMENT

Not Applicable

CITED REFERENCES

The following references are cited within this invention description:
[1] Sloane, N. J. A., 'Tables of Sphere Packings and Spherical Codes', IEEE Transactions on Information Theory, May 1981
[2] Sloane, N. J. A., 'The Sphere Packing Problem', Documenta Mathematica (Extra Volume), 1998
[3] Conway, J. H., Sloane, N. J. A., 'Sphere Packings, Lattices and Groups', Springer-Verlag, $3^{rd}$ Edition, 1998
[4] Ban, A., Litsyn, S., Alrod, I., 'Method for Increasing Information Content in a Computer Memory', U.S. Pat. No. 6,469,931
[5] Conway, J. H., Sloane, N. J. A., 'Fast Quantizing and Decoding Algorithms for Lattice Quantizers and Codes', IEEE Transactions on Information Theory, March 1982
[6] Conway, J. H., Sloane, N. J. A., 'Soft Decoding Techniques for Codes and Lattices, Including the Golay Code and the Leech Lattice', IEEE Transactions on Information Theory, vol. 32, January 1986

BACKGROUND OF THE INVENTION

This invention is related to the increasing of discrete information storage capacity in memory devices. Memory devices typically store discrete information in cells, whereby information is encoded by means of setting, or writing, the value of certain physical variables of said cells, characteristic of the memory device technology. Said cells may consist of some kind of transistor in a semiconductor memory (such as the so called flash memory), or a small allocated area of some optical media (such as the so called CD or DVD) or magnetic media (such as the so called HD).

Said physical variables would be, for example, some optical property in optical memory devices, some magnetic property in magnetic memory devices, some electrical property such as electrons charge or voltage in semiconductor memory, etc. Physical constraints would typically limit the smallest allowable physical variable value to some value, say b, the largest physical variable value to some other value a>b, so that the resulting allowable said physical variable value range is (a−b).

Encoding information, in regards to this proposed invention, is discrete in nature, that is both information and the corresponding physical variables are assumed to take values out of two corresponding predefined finite sets of values. The storing of information incurs then the mapping of a (say integer, or equivalently binary) piece of information into the value (or values) of said physical variable, and then the setting of a cell (or a group of cells) to that said value (or values), said setting usually called memory writing or programming. It is possible to measure the storage capacity of a memory by the largest integer that may possibly be written into it, or equivalently, by the number of binary units (bits) required to represent said largest integer.

Recovery of stored information involves the sensing or read-back of the value (or values) of said programmed physical variable of said cell (or group of cells); due to physical phenomena both said memory programming and this said read-back are generally noisy in nature and the value of the read back physical variable (which belongs to the continuum rather than to the discrete domain) differs from the originally (discrete) mapped value(s). Said information recovery then incurs two actions: first, the association of the (continuous) read back value(s) to the closest discrete permissible value(s) of said physical variable, usually called detection; and second, the decoding of said selected detected permissible value(s) back into the said piece of information (say integer, or equivalently binary) value.

There exist at least three ways to increase said storage capacity, namely:
a. increasing the number of memory cells in a device; this in general directly affects the cost of said device;
b. increasing the storage capacity of individual memory cells, by letting each cell store more than one bit; this can be achieved by setting the allowable number of discrete values of said physical variable to more than two; for example, in current art non-volatile, so called flash, semiconductor memory, c (=2 or more) bits-per-cell (bpc) are sometimes stored by letting the number of permissible discrete values be $2^c$ (=4 or more); since as noted above the range of permissible discrete values is limited to (a−b), the exponential increase of required number of discrete values with the increase in number of bits-per-cell rapidly decreases the minimal distance, denoted 2r, between permissible values affecting the reliability of the read back i.e. increasing the probability of a bit error event;
c. enhancing the information encoding efficiency; as will be readily shown this can be achieved by considering information encoding as a so called sphere packing problem, by collectively encoding a block or piece of information (rather than a single bit or small group of bits) into a set of cells (rather than into a single cell).

This proposed invention, while fully compatible with the fore-mentioned first two ways of memory storage capacity increase, deals specifically with said third way of storage capacity increase.

The sphere packing problem in a multi-dimensional space $R^n$ has been extensively studied (e.g. [1], [2], [3]). Loosely stated it consists of finding ways to place as many as possible 'solid' hyper-spheres of radius r in a specified region of $R^n$; by 'solid' we mean that hyper-spheres are allowed to touch each other, but not to overlap.

The application of sphere packing concepts to memory storage and communication systems capacity increase has been proposed in [3] as early as 1999 (and possibly earlier) where, quoted, " . . . We begin by describing the second main application of sphere packings, the design of signals for data transmission or storage systems", and also " . . . From now on we shall just describe the data transmission problem always keeping in mind that there are identical results for data storage systems". However: no solution is provided in [3] to the information encoding/decoding associated essential problem, whereby a one-to-one mapping is required between a bounded integers set and lattice points confined to a hyper-cube (or to some other closed region) of lattice space.

The application of sphere packing concepts to memory storage has been also proposed in [4]. However, strict constraints were imposed in [4] on r and on (a−b), the respectively fore-mentioned hyper-spheres radius and physical variable permissible range and a specialized encoding/decoding method which fits very specific sphere packings was devised. As result of these strict constraints and specialized encoding method of [4] only relatively very modest memory storage capacity gains were achieved. For example, for a memory sphere packing structure in $R^n$, n=16 and supporting a nominal density c=1 bpc it is quoted ([4]) that "The method detailed above . . . which has been demonstrated on codes for 16 cells, with an information gain of 25%, is directly applicable to higher orders for 32, 64, 128 etc. cells" and also "A gain of 50% is attainable for n≧128". By 'nominal density' we mean in the sequel the bit density achieved by spheres of given radius, confined to a cube of given size, and packed by means of the simplest integer (or cubic) lattice $Z_n$ as further detailed below.

It should also be noted that increasing the dimension of our space $R^n$ has direct impact on the memory latency (i.e. the time period required to program and/or to read back memory information) and/or on cost of the memory cell sensing resources (such as so called analog-to-digital converters), the memory cell programming resources (including so called digital-to-analog converters) and the required computational power to encode, to detect, and to decode memory information. Hence it would be beneficial to achieve as much storage capacity gain as possible at the lowest possible space dimension n.

It is then the goal of this proposed invention to significantly improve the achievable memory storage capacity gain; for example, it will be demonstrated in the sequel that for a memory structure with nominal c=1 bpc (as in [4]) a memory storage capacity potential gain of 50% is possible with n=8 (compared with n≧128 in [4]), a potential gain of 75% is possible with n=16 (compared with 25% in [4]), a potential gain of 100% is possible with n=24, and even higher gains are possible for even larger space dimensions n.

Said possible memory storage capacity gains of our proposed invention are made possible, by a. the exploitation of 'dense' lattices for a most efficient solution of the sphere packing problem; b. the introduction of a novel and computationally simple encoding and decoding method; and c. (weak) relaxation of the hyper-sphere radius r constraint and/or of the physical variables (a−b) permissible range.

OBJECTIVES AND ADVANTAGES OF THE INVENTION

It is the main objective of this proposed invention to present a method and corresponding apparatus to increase the information storage capacity of memory devices in which information can be stored in groups of cells, encoded in the joint values of some continuous domain physical variable, said joint values corresponding to lattice points, and said lattices including lattices of high sphere packing density both known today as well as lattices to be discovered in the future.

It is a main benefit of this proposed invention to achieve significant memory storage capacity gain (e.g. 100% or more) even when said groups of cells contain each a relatively small number of cells, incurring low implementation complexity and/or low memory write and read-back latency.

It is a second main benefit of this proposed invention to facilitate said increase of information storage capacity by devising a computationally efficient information encoding and decoding method.

It is a third major benefit of this invention to have its potential application in one or more bits-per-cell implementations of different memory technologies such as semiconductor, optical and magnetic.

SUMMARY OF THE INVENTION

The storage capacity of a memory device can be greatly increased if information is stored in groups of memory cells, in a way easily represented as a sphere packing model.

A significant class of sphere packing structures, efficient (in the sense of large number of sphere centers per unit volume, i.e. 'dense') can be represented in lattice form.

The storage of information in memory devices can be then interpreted as the one-to-one mapping of a piece of information (typically in integer or binary form) d into a point p belonging to said lattice. Said lattice point p represents a vector of values of a physical variable (such as voltage or charge in a flash type memory, etc.) applied in order to 'store' the required information. The mapping of d into p would be usually called encoding; the converse, i.e. the mapping of p into d would be usually called decoding.

In actual memory implementations said lattice points p are confined to a region of the $R^n$ space. This confined region is usually an hyper-cube defined by edges of (a−b) length where a and b represent the extreme permissible values of the said physical variable employed in order to 'store' the required information, so that b≦p≦a, where a=(a a a . . . a)', b=(b b b . . . b)', where inequalities are defined element-wise, and where (.)' denotes the matrix transpose operator.

Said confined lattice points p may be then envisioned as being the centers of solid hyper-spheres of radius r. The minimal distance between two such hyper-spheres is then 2r.

Said information piece d can be usually represented, without loss of generality, in the form of a bounded integer d∈[0, (N−1)] where N is the total number of hyper-spheres enclosed in said lattice confined region. Due to the binary nature of our modern world information devices, N would conveniently (but not strictly necessarily) be equal to an integer power of 2. The desired encoding method would then allow to efficiently map a bounded integer d into a confined lattice point b≦p≦a. Conversely, the sought decoding method would allow to efficiently convert from a said confined lattice point p back to an integer (equivalently, an information piece) d.

Novel computationally efficient said one-to-one lattice encoding and decoding methods are herein proposed. These encoding and decoding methods incur the representation of any said selected lattice by means of a triangular lattice generator matrix. This facilitates in turn the conceptual representation of said lattice points b≦p≦a confined to an hyper-cubic space region by means of a 'tree' data structure.

During the encoding process, and exploiting this tree structure, d is represented in a (typically mixed-radix) positional numbering system by a vector e which uniquely specifies the relative position of d in each of said tree branches. Then working backwards (from bottom up) said tree, layer by layer, the integer vector elements $m_i$, i=1, 2, . . . , n, which describe said information d (or its equivalent vector e) in terms of a confined lattice point p are calculated as will be described in the sequel.

Conversely, during the decoding process, a said confined lattice point p is given (result of an implicit memory read-back and detection process), described by its associated integer vector m. Working backwards said tree the said (typically mixed radix) representation e of m is calculated as detailed in the sequel. And this representation is finally converted into our decoded (recovered) d.

DETAILED DESCRIPTION OF THE INVENTION

Informally stated a lattice consists of a countable infinite set of regularly spaced points in $R^n$. A lattice may be represented by its lattice generator matrix $P \in R^{n \times n}$ (we will herein deal with square generator matrices) so that any lattice point $p \in R^n$ is given by $$p = Pm \quad (1)$$

where $m \in Z^n$ is a lattice point descriptor integer vector, and where the columns of P are the basis vectors of said lattice. We interchangeably will use P in the sequel to denote both the lattice generator matrix and the lattice itself, and will use either p or m to denote a given lattice point.

The problem of efficient information encoding into a group of cells of a memory device can be readily modeled as the problem of sphere packing, that is that of packing solid hyper-spheres in $R^n$ with maximal 'density' (roughly defined, density defines the proportion of space that is occupied by said solid spheres).

Figure 1:
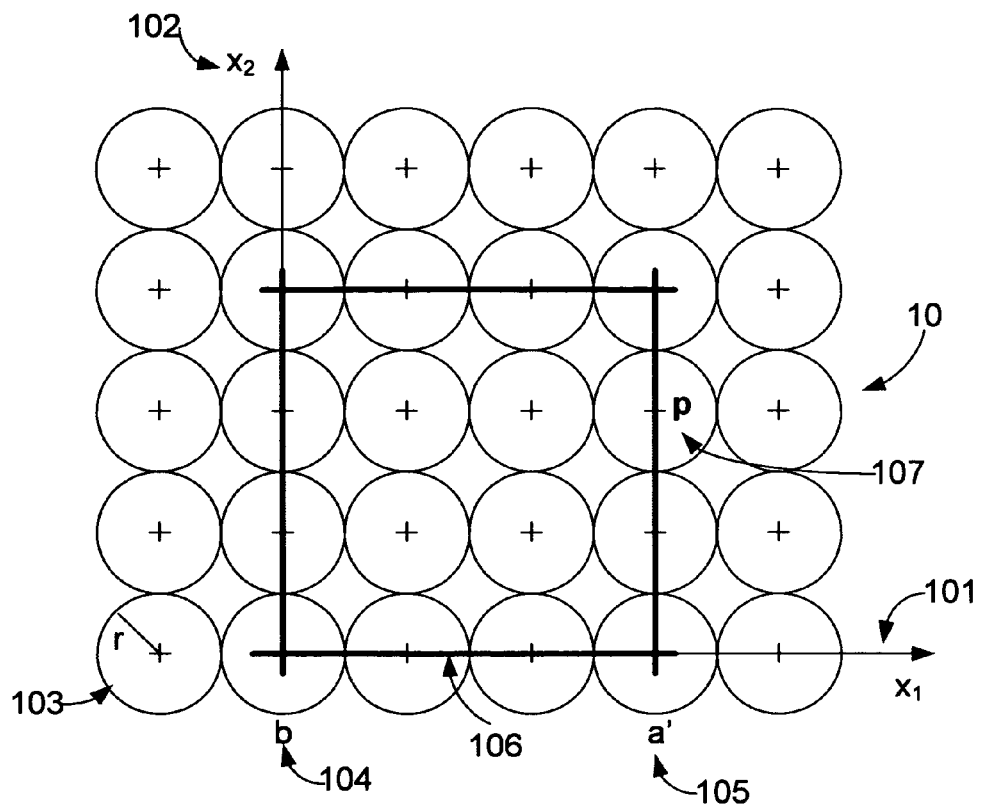
FIG. 1 presents the $Z_2$ integer lattice and the $A_2$ dense lattice in $R^2$.
Figure 1:
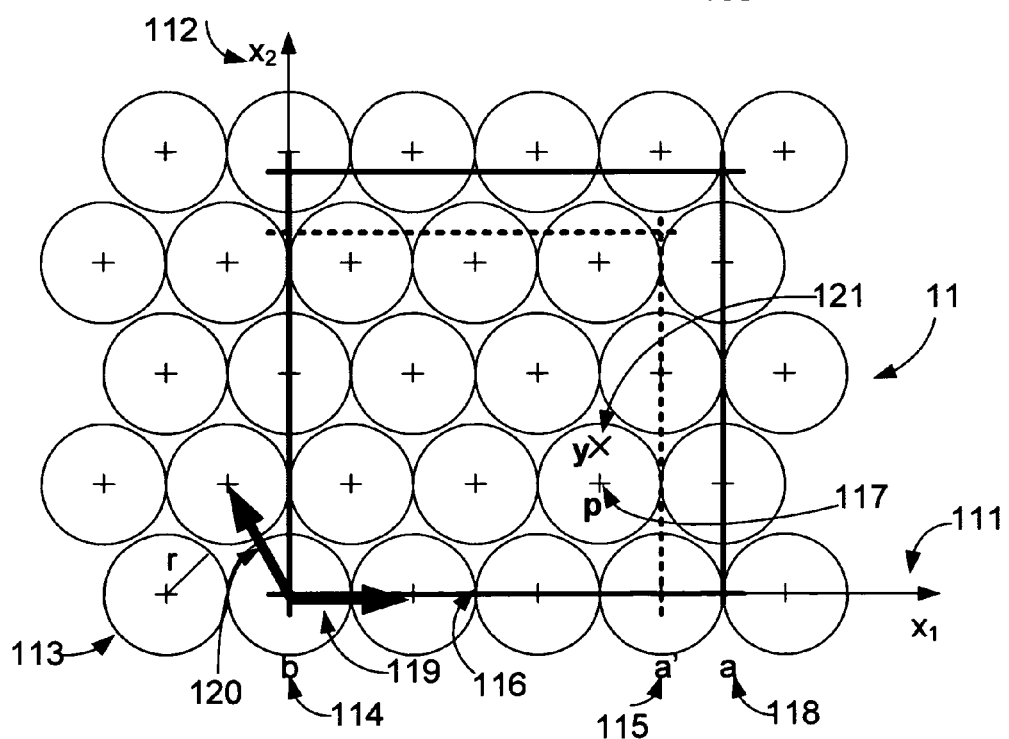

A class of lattices is relevant to the solution of said sphere packing problem. Refer to FIG. 1 where 10 of FIG. 1 describes the integer (or cubic) lattice $Z_2$ (e.g. [1]). The lattice is referred to Cartesian axes $x_1$ 101 and $x_2$ 102. In $Z_2$, spheres of radius r such as 103 are packed on top and aside of each other as shown in 10. The centers of said spheres represent lattice points such as p 107 in $R^2$. In our memory device information encoding problem each said lattice point p 107 defines the physical variable (such as voltage or electron charge in flash memory devices, etc.) joint values of a group of memory cells.

Due to physical constraints of memory technologies, the physical variable values are confined to extremes b 104 and a' 105, thus defining an hyper-cube (i.e. square) in $R^2$, delimited by segments such as 106 as shown in 10 of FIG. 1. The number c of bits-per-cell and the sphere radius r define the length of the hyper-cube edge 106 as $$(a' - b) = 2r(2^c - 1) \quad (2)$$

Thus for a nominal c=2 bpc example as shown in 10 of FIG. 1, (a'-b)=6r as shown in said figure. It is also easily verified that for this cubic lattice, the generator matrix $P(Z_2)=2rI$ where I is the identity matrix. We note also that the edge length (not shown in 10 of FIG. 1 for the sake of clarity) of a hyper-cube which fully encompasses these spheres is (a'-b+2r).

We refer now to 11 of FIG. 1 which depicts $A_2$, the densest lattice sphere packing in $R^2$ (again, e.g. [1]). The lattice is referred again to Cartesian axes $x_1$ 111 and $x_2$ 112, the radius of hyper-spheres such as 113 is denoted r, and lattice points p are again centers of hyper-spheres such as 117. A hyper-cube of same size as that of 10 of FIG. 1 is indicated by its extremes b 114 and a' 115. The lattice generator matrix of $A_2$ is:

$$P(A_2) = r \begin{bmatrix} 2 & -1 \\ 0 & \sqrt{3} \end{bmatrix}.$$

The lattice basis vectors r.(2 0)' and r.(-1 √3)' are respectively shown by 119 and 120 in 11 of FIG. 1.

By direct visual comparison of the 'void spaces' in 11 with those of 10, both of FIG. 1, it can be readily perceived that lattice $A_2$ is denser than $Z_2$.

Associated with a lattice P is its density D(P) which may be informally defined as the fraction of $R^n$ occupied by the spheres. The lattice density of P is given (e.g. [1]) by $$D(P) = V_n r^n / |P| \quad (3)$$

where $V_n$ is the volume of a unit radius hyper-sphere and |.| denotes the matrix determinant operator. In the $Z_2$ case, shown in 10 of FIG. 1, it is easily verified that $D(Z_2) = V_2/2^2 = \pi/4$. The density of $A_2$ on the other hand is readily seen to be $D(A_2) = \pi/(2\sqrt{3}) > D(Z_2)$ indeed, as intuitively observed above.

For a given lattice P the number of hyper-spheres N(P) enclosed in a hyper-cube of edge length (a'-b+2r) is (utilizing (3) above)

$$N(P) = [(a' - b + 2r)^n / V_n r^n] D(P) = (a' - b + 2r)^n / |P| \quad (4)$$

and the number of information bits that such N(P) can represent is given by $\log_2(N(P))$. For $Z_2$ and c=2 bpc we immediately get $N(Z_2) = 2^{2n} = 16$ spheres and $\log_2(N(Z_2)) = 2n = 4$ bits as trivially expected. Thus there is no gain, in using lattice $Z_2$, over the encoding of information into individual cells; both models are equivalent.

The net bit capacity gain G(P) of any lattice P of dimension n relative to our reference cubic lattice $Z_n$ is given by $$G(P) = \log_2(N(P)) - \log_2(N(Z_n)) = \log_2(|Z_n|/|P|) = \log_2 ((2r)^n/|P|) = n - \log_2 |(1/r)P| \quad (5)$$

We note that G(P) depends only on the unity radius lattice generator matrix (1/r) P; in particular, it does not depend on c, the nominal number of bits-per-cell (equivalent to the length, measured in radius units, of cube edge 116 of 11 of FIG. 1), nor on r, the spheres radius. We readily calculate $G(A_2) = \log_2(4/(2\sqrt{3})) \cong 0.2$ bits over an n=2 cells group, this is equivalent to about 10% bit gain at a nominal c=1 bpc (and 5% at nominal c=2 bpc), possibly too modest to care; $A_2$ was hence herein shown mainly for conceptual visualization.

By employing known dense lattices, G(P) grows quickly with the dimension n. For example, calculating the determinants of a few important lattices (again, [1]) yield, by applying (5) above:

$G(E_8) = 4$ (over a group of 8 cells), i.e. 50% bit capacity gain at a nominal c=1 bpc (and 25% at c=2 bpc);

$G(\Lambda_{16}) = 12$, i.e. 75% bit capacity gain at a nominal c=1 bpc (this could be contrasted with a gain of 25% for a group of 16 cells in [4] at nominal c=1 bpc);

$G(\Lambda_{24}) = 24$, i.e. 100% bit capacity gain at a nominal c=1 bpc, where $E_8$ is the densest, and $\Lambda_{16}$, $\Lambda_{24}$ are the densest known, lattices in their respective dimensions. Dense lattices are known in higher dimensions n as well and, for example ([3]), $MW_{80}$ may yield ~150% and $MW_{128}$~175% bit capacity gains at nominal c=1 bpc.

These significant memory storage capacity gains provide strong motivation to devise an efficient confined lattice points encoding and decoding method as proposed in this present invention.

In some cases there might be some penalty paid, in probability of information read-back error, to achieve this potential gain. We refer again to 11 of FIG. 1. As mentioned above the (continuum domain) spheres occupied volume inside the hyper-cube of edge length (a'–b) has increased, relative to an equal size hyper-cube of $Z_2$ (shown in 10 of FIG. 1). In spite of that, counting the number of the (discrete domain) hyper-spheres centers, such as 117, we note that it has not increased, but in fact decreased (14 centers in 11 vs. 16 centers in 10, both of FIG. 1). This is the combined result of the 'tilting' of $A_2$ basis vectors 119 and 120 relative to the Cartesian axes 111 and 112, and of the discrete domain nature of hyper-spheres centers. Since it is the number of confined hyper-spheres centers, i.e. lattice points, which in fact define storage capacity, then this fore-mentioned tilt causes some capacity loss.

To regain the predicted memory storage capacity it is necessary to compensate for above mentioned 'tilt'. A possible way to do that is to slightly increase the length of the hyper-cube, e.g. to set the hyper-cube edge length to (a–b) as shown by 118 and 114, instead of (a'–b) as shown by 115 and 114, both of 11 of FIG. 1. In actual memory devices this is equivalent to expanding the total permissible range of the physical variable exploited for storage (such as voltage range or electron charge range in flash memory, etc.). If this is possible then no loss in error probability is incurred since the hyper-spheres radius remain the same r as shown in 11 of FIG. 1, so that the said minimal distance between hyper-spheres centers is preserved.

In some physical implementations this hyper-cube expansion (i.e. physical variable range extension) might not be allowed. In such cases r could be contracted so that the hyper-cube is reduced back to an edge length (a'–b) (but with smaller spheres radius r). Said radius r is (half) the minimal distance between any 2 hyper-spheres and in a memory storage device is directly related to the memory read back probability of error. The smaller r is, the larger the probability of an error event and vice versa. To compensate for this possible read-back increased error probability some additional Error Correction Coding (ECC) could be applied to maintain the target read-back error probability. This would cost some bits so that the net storage capacity gain would be somewhat less than that as predicted by (5).

To give an example, it can be shown that $E_8$ would require, in order to achieve the predicted storage capacity gain merely an hyper-cube edge length increase of (a –a')=r, i.e. a total hyper-cube edge length of 7r (instead of original 6r, for a nominal c=2 bpc) or 3r (instead 2r for c=1 bpc); alternatively the hyper-cube size would remain the same, and r would have to be contracted to $6/7$ r (for nominal c=2 bpc) and $2/3$ r (for nominal c=1 bpc). Similar slight modifications (in cube edge length or in sphere radius) can be shown for other lattices. The minimal required extension of the hyper-cube edge length (a–b) for a selected lattice (or alternatively, the minimal required contraction of r) should be pre-calculated; this can be easily done by anyone reasonably skilled in the art.

It should be noted that the constraint relaxation of the hyper-cube edge length (i.e. its expansion) and/or the hyper-sphere radius (i.e. its contraction) is an essential differentiator and innovation of this proposed invention. It in fact allows the usage of highly dense lattices for the solution of this storage enhancement problem. Failure to relax both would generally require the usage of inefficient sphere packings with their associated poor bit capacity gain as exemplified by e.g. [4].

In addition to the memory information encoding and decoding problems, i.e. the subject of this proposed invention, the usage of memory devices includes the solution of the detection problem, that is the association of a read-back noisy vector such as y 121 to the closest (closest in some suitable metrics sense) lattice point p 117 both of 11 of FIG. 1. The solution to this problem which yields the smallest probability of error is the so called Maximum Likelihood Detection (MLD); under the disturbance of independently identically distributed (i.i.d.) noise samples the MLD solution has been efficiently solved for several important lattices. For example [5] presents (amongst others) MLD cost efficient solution to $E_8$, and [6] present MLD solutions to the Leech lattice, $\Lambda_{24}$.

As described above, lattices are characterized by their generator matrix P, a general (usually square) matrix. It is an essential idea of this proposed invention to a-priori convert (as may be required in the general case) P into a (say upper) triangular matrix R and to exploit this said triangular generator matrix R in a way that will be detailed in the sequel for the implementation of an efficient encoding (and decoding) method of a bounded integer d∈[0, (N−1)] into (and from) confined lattice points b≦p≦a. Said conversion can be easily executed a-priori by means of the well known QR decomposition, so that P=QR where R is a (say upper) triangular matrix and Q is a unitary matrix (i.e. Q' Q=I).

Since Q is just a simple rotation, the geometric properties of said lattice are conserved, in particular each basis vector norm, all inter-vector angles and lattice points minimal distance. Any hyper-cube confined lattice point will be then hereon represented by $$p = Rm = \begin{bmatrix} r_{11} & r_{12} & r_{13} \\ 0 & r_{22} & r_{23} \\ 0 & 0 & r_{33} \end{bmatrix} \cdot \begin{bmatrix} m_1 \\ m_2 \\ m_3 \end{bmatrix}, b \leq p \leq a \quad (6)$$

where an explicit triangular lattice generator matrix in $R^{3\times 3}$ and descriptor vector in $R^3$ are shown as a demonstrative example. Obviously said conversion needs not be done if R=P, i.e. if a lattice is given a-priori in its triangular form. It is also obviously of no essence to the method disclosed in this invention if R is upper or lower triangular. Finally, it should be clear to anyone skilled in the art that this method could be similarly applied, through trivial adaptations, if said conversion to triangular is executed on $P^{-1}$ (rather than on P itself), or equivalently, if $P^{-1}$ (rather than P) is given a-priori in triangular form.

Figure 2:
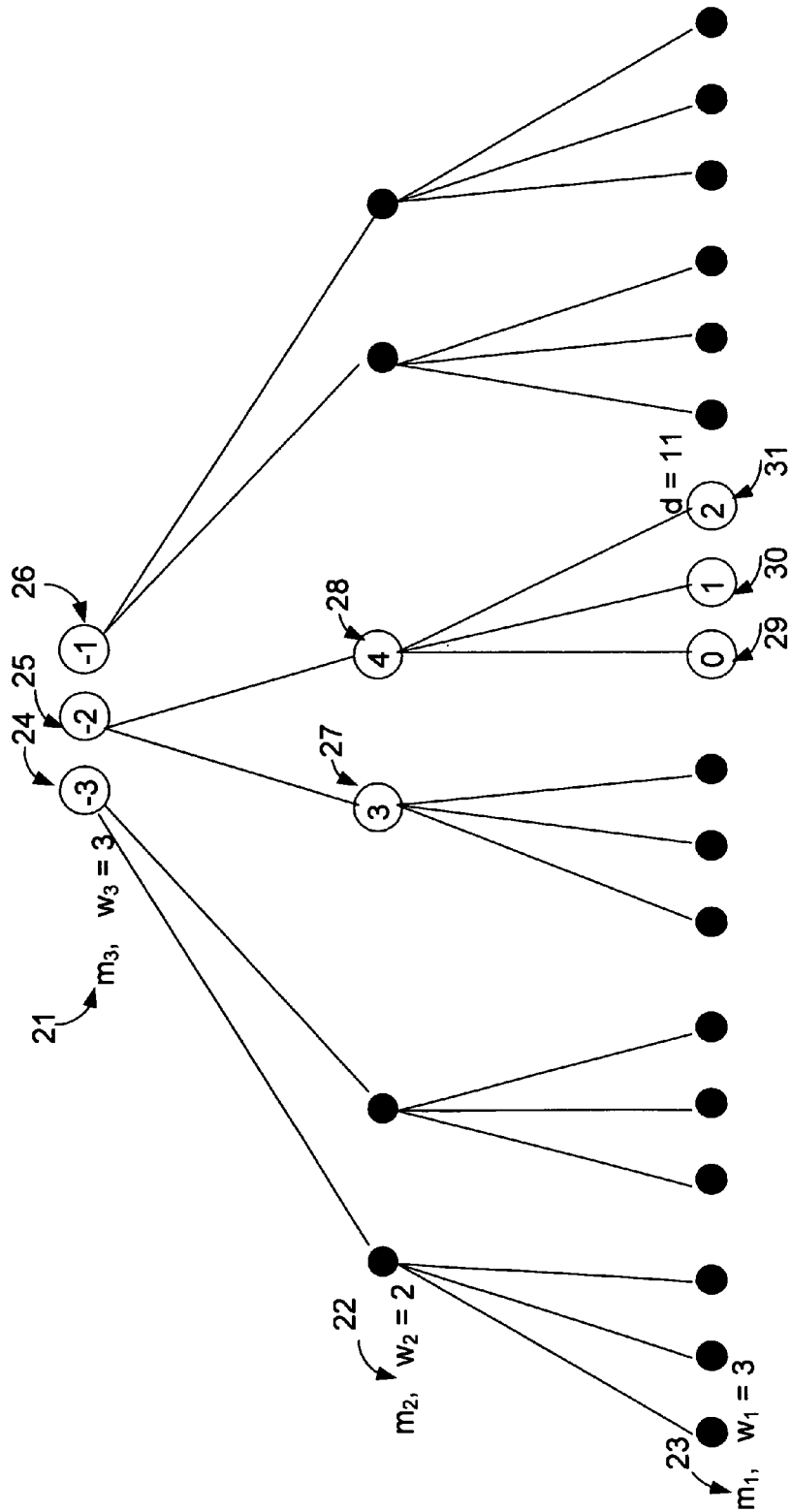
FIG. 2 describes an example of a tree data structure of confined points of a hypothetical lattice.

We now refer to FIG. 2. It is an essential idea of this proposed invention that once a lattice is given by its triangular generator matrix R it is possible to represent all lattice points confined to a said hyper-cube in a neat tree data structure as shown in FIG. 2. To do so, we commence from the last row of (6); it is immediate from (6) that $b \leq r_{33} \, m_3 \leq a$, from which, assuming without loss of generality, (w.l.o.g.) that $r_{33}>0$, we get $(b/r_{33}) \leq m_3 \leq (a/r_{33})$. Since m is an integer vector then $$m_{3,min} = \text{ceil}(b/r_{33}) \quad (7a)$$

$$m_{3,max} = \text{floor}(a/r_{33}) \quad (7b)$$

and the number of $m_3$ feasible integer values is given by $$w_3 = (m_{3,max} - m_{3,min} + 1) \quad (7c)$$

where ceil(.) and floor(.) are the round operators, towards positive and negative infinity respectively. Hence $m_3$ can take any of the consecutive values ($m_{3,min}$, $m_{3,min}+1, \ldots, m_{3,max}$). In our hypothetical example, with some given R, a and b we assume that $m_{3,min}=-3$ and $w_3=3$, so that $m_3$ can be valued as '−3', '−2', and '−1' as indicated by the tree nodes 24, 25 and 26 in tree layer 21 of FIG. 2.

We now proceed to calculate a set of feasible integer values for $m_2$, utilizing the next upper row in R above. Since $b \leq (r_{22} m_2 + r_{23} m_3) \leq a$, then for each feasible integer value of $m_3$ as found above, we get (assuming again w.l.o.g. that $r_{22} > 0$):

$$m_{2,min}(m_3) = \text{ceil}((b - r_{23} m_3)/r_{22}) \quad (7d)$$

$$m_{2,max}(m_3) = \text{floor}((a - r_{23} m_3)/r_{22}) \quad (7e) \text{ and}$$

$$w_2(m_3) = (m_{2,max} - m_{2,min} + 1) \quad (7f)$$

For each feasible value of $m_3$ a set of $w_2(m_3)$ nodes is drawn such as 27 and 28 in tree layer 22 of FIG. 2. We will call such a set of 'children' nodes as 27 and 28, with a common 'parent' node, a tree 'branch'. In our hypothetical example we assume that node 27 is valued '3' and node 28 is valued '4'. By appropriate expansion of a (or contraction of r) as described in the paragraphs above, and due to the regularity of lattices, a common equal value of $w_2(m_3)$ for all $m_3$ usually results (otherwise the minimal value can be chosen). The assignment of such a common value of $w_i$ to all branches of a given tree layer consist of an essential idea of this proposed invention. For this hypothetical lattice, $w_2=2$ as indicated by 22 of FIG. 2 where we have omitted the dependency of $w_2$ on $m_3$. We call $w_i$, for reasons that will become clear momentarily, the radix of layer $m_i$ of our tree. Different layers may have different radixes such as shown in FIG. 2 where $m_3$ layer has $w_3=3$ as shown in 21, and $m_2$ layer has $w_2=2$ as shown in 22. Hence, our tree may be a mixed radix tree.

This process can be easily extended, and generalized, until we get to the bottom layer of our tree, for which $w_1=3$ in our example, as denoted by 23 of FIG. 2 and where sample nodes 29, 30 and 31 are valued '0' to '2'. In a preferred embodiment of our proposed invention, the radix vector $w=(w_1\ w_2 \ldots w_n)$ should be pre-calculated for each selected lattice; for example it can be shown that $E_8$, with b=0 and a=7r (for nominal c=2 bpc) yields $w(E_8)=(4\ 4\ 4\ 4\ 8\ 8\ 8\ 8)$. Each 'leaf' in the tree (that is, node at the bottom layer of the tree) represents a confined lattice point p. It is easily verified that the total number of leaves (equivalent to the number of lattice points p inside the defined hyper-cube), is $N(R)=\Pi w_i$, i=1, 2, ..., n, where $\Pi$ denotes the product operator. This equals $3\times 2\times 3=18$ in the $m_1$-layer 23 of FIG. 2, and equals $4^4 \times 8^4 = 1048576$ lattice points in the $E_8$ example above, that is $N(E_8)=2^{(2n+G(E_8))}=2^{20}$ as expected. We can uniquely number leaves of our tree, left to right, from 0 to (N(R)−1). In our example, leaf 31 of FIG. 2 is then numbered d=11 as can be easily verified.

We now demonstrate a preferred embodiment of the encoding method of this proposed invention by means of an example. We have a bounded integer $d \in [0, 17]$ such as d=11, shown as tree leaf 31 in FIG. 2, which we wish to map into a confined lattice point p as equivalently described by its integer vector m. We have pre-calculated the radix vector of our tree w=(3 2 3). We notice that any tree leaf is uniquely defined by its relative position within its branch, by the relative position of said branch within its parent branch, and so on all the way up. We define then a vector e of relative branch positions. By visual inspection we note that for a leaf such as 31 of FIG. 2 e(d=11)=(2 1 1) where for convenience and w.l.o.g. we denote the leftmost position of each branch by '0'.

To calculate e, we proceed element by element, so that $f_0 = d$, $e_1 = \text{rem}(f_0/w_1) = \text{rem}(11/3) = 2$ and $f_1 = \text{fix}(f_0/w_1) = \text{fix}(11/3)=3$ where 'fix' denotes the round towards zero operator, 'rem' denotes the remainder after division, and $f_i$ is an auxiliary variable. Similarly $e_2 = \text{rem}(f_1/w_2) = \text{rem}(3/2) = 1$ and $f_2 = \text{fix}(f_1/w_2) = \text{fix}(3/2) = 1$; and finally $e_3 = \text{rem}(f_2/w_3) = \text{rem}(1/3)=1$ and $f_3 = \text{fix}(f_2/w_3) = \text{fix}(1/3) = 0$. The process shown above, which results in $e = (e_1\ e_2\ e_3) = (2\ 1\ 1)$, is a simple radix conversion and the vector e is in fact the mixed radix representation of d (=11) in terms of the mixed radix vector w.

For the second and final stage of the d to m encoding method, in accordance with this proposed invention, we take the mixed radix vector e as calculated above, and process our tree again, this time from top to bottom; we readily calculate $m_{3,min}$ (=−3) as per (7a) above and since $e_3$ defines the position within $m_3$ branch then $m_3 = m_{3,min} + e_3 = -3+1 = -2$ as indicated by 25 of FIG. 2; then, for this value of $m_3$ we calculate the corresponding value of $m_{2,min}$ as per (7d) above, which happens to result in $m_{2,min}=3$ as shown in 27 of FIG. 2, so that $m_2 = m_{2,min} + e_2 = 3+1 = 4$ as indicated by 28 of FIG. 2; and, finally and similarly for $m_1$ which would result in $m_1 = m_{1,min} + e_1 = 0+2 = 2$ as shown in 31 of FIG. 2.

Figure 3:
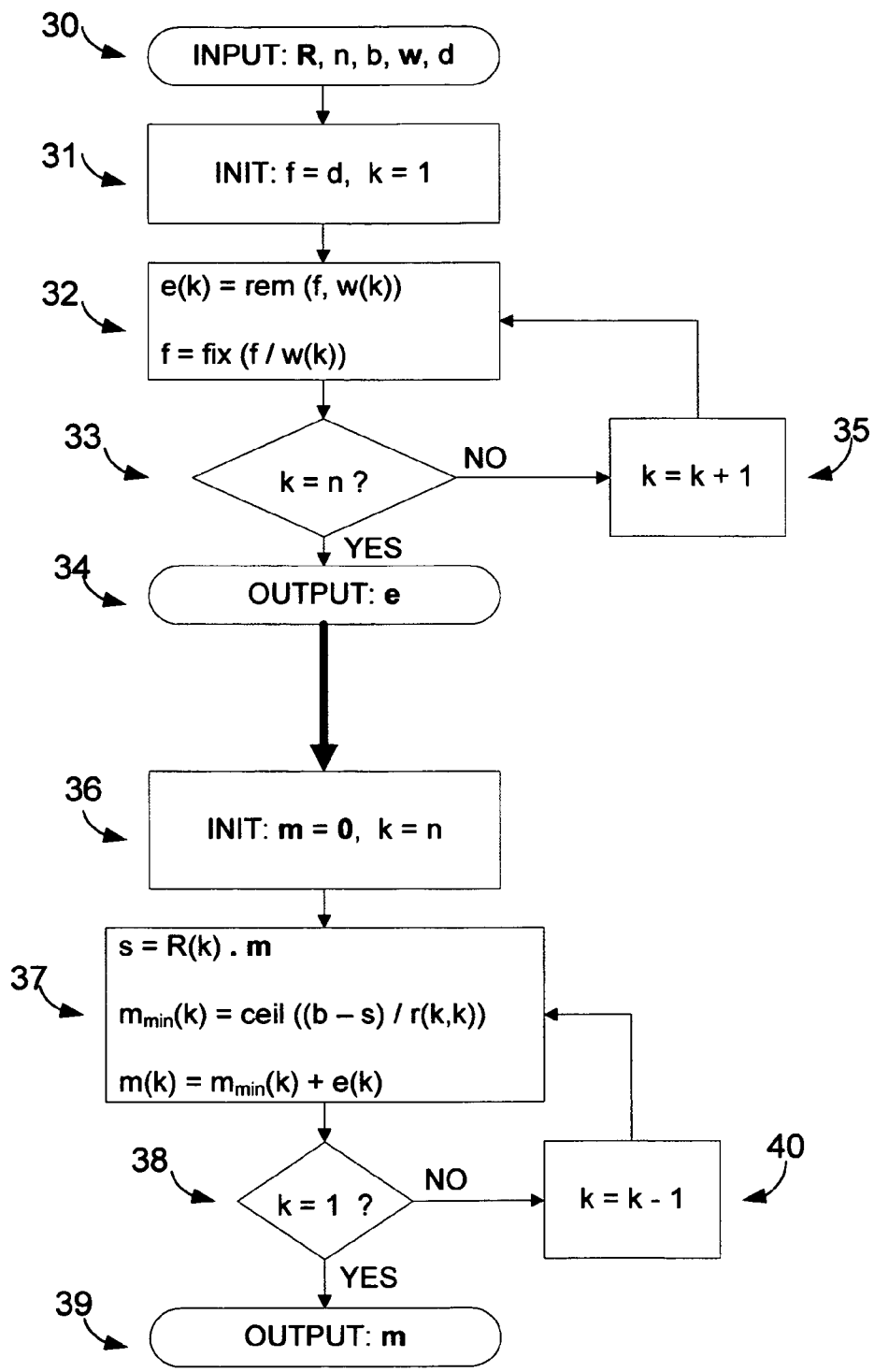
FIG. 3 shows the flowchart of a preferred embodiment of the proposed encoding method.

The proposed invention encoding method can be generalized and formalized as shown in the flowchart of FIG. 3, which is divided in two sections, the branch position vector e calculation, 30 to 35; and the lattice point integer descriptor m calculation, 36 to 40, all of FIG. 3. Inputs to the encoding process, shown in 30 of FIG. 3, are the (say upper, w.l.o.g.) triangular generator matrix R of the lattice of choice; the number of cells n (dimension of R); the lowest physical variable value b; the pre-calculated (possibly mixed) radix vector w; and the to-be-encoded information in the form of an integer $d \in [0, (N-1)]$. In 31 of FIG. 3 an auxiliary variable f and a loop index k are initialized. In 32 of FIG. 3 relative branch position vector elements e(k) are iteratively calculated along with auxiliary variable f update (used at next iteration). In 33 of FIG. 3 the iteration loop condition is tested. If not done yet, the iteration index k is incremented in 35 and 32 is repeated, otherwise the branch position vector e is ready in 34, all of FIG. 3.

Initialization of the result vector m and of the iteration index k (to top layer n this time) takes place in 36. In 37 of FIG. 3 an auxiliary scalar s is calculated by means of the current value of m and a selected row of R (denoted R(k), not to be confused with the diagonal element $r_{kk}$), followed by the calculation of $m_{min}$ (k); these consist of a simple generalization of (7d) above; and the next element m(k) is calculated. The iteration loop condition is tested in 38; if not done yet, the iteration index k is decremented in 40 and 37 is repeated, otherwise the lattice point descriptor vector m is ready in 39, all of FIG. 3. It should be obvious from this description, but nevertheless mentioned, that at no time the whole (typically huge) conceptual tree of FIG. 2 needs to be calculated, but only a very few selected ad-hoc parts of it as indicated above. Upon the completion of the encoding process as detailed in FIG. 3 an arbitrary bounded integer is uniquely mapped into a lattice point confined to an hyper-cubic region of R''.

We return now back to FIG. 2, to demonstrate the confined lattice points decoding method, in accordance with a preferred embodiment of this proposed invention, by means of example. Assume that during memory device read-back a vector y has been read (such as 121 of FIG. 1, to which we briefly refer), and that a lattice detector (such as an MLD, out of the scope of this invention) associates said reading y with a lattice point p=R m, given by its integer descriptor vector m, and where the lattice generator matrix R is (say upper) triangular as detailed above. Let as example be that $m=(m_1\ m_2\ m_3)'=(2\ 4\ -2)'$ and that we wish to decode m that is to map it back into some $d \in [0, 17]$. We have, as before, pre-calculated the radix vector of the confined lattice points tree w=(3 2 3).

We first turn to calculate the fore mentioned vector e of relative branch positions. To do that, we process the tree (say, w.l.o.g., from top to bottom). By means of (7a) above we calculate $m_{3,min}$ (=−3) as shown by 24 of FIG. 2; then, since in our example $m_3$=−2, we immediately find $e_3$=$m_3$−$m_{3,min}$=−2−(−3)=1, as indeed indicated by 25 of FIG. 2 (recall that we count branch positions left to right, commencing by '0'). Given said $m_3$ we calculate now $m_{2,min}$ as per (7d) above, which would result in $m_{2,min}(m_3$=−2)=3, as shown by 27 of FIG. 2. This would yield $e_2$=$m_2$−$m_{2,min}$=4−3=1, as indicated by the position of 28 of FIG. 2. Finally we would calculate $m_{1,min}(m_3$=−2, $m_2$=4)=0 (as per 29 of FIG. 2) which would result in $e_1$=$m_1$−$m_{1,min}$=2−0=2, as verified in 31 of FIG. 2. Thus $e$=($e_1$ $e_2$ $e_3$)=(2 1 1).

For the second and final stage of the m to d decoding method, in accordance with this proposed invention, we take the mixed radix vector e as calculated above, and convert it into d, a simple radix conversion. For this purpose we notice, by examination of the leaves (bottom) layer of our tree, that $d(m)$=$e_3.w_2.w_1$+$e_2.w_1$+$e_1$=1.2.3+1.3+2=11 as expected and verified in 31 of FIG. 2; this said radix conversion can be implemented by a simple recursion formula as will be shown in FIG. 4.

Figure 4:
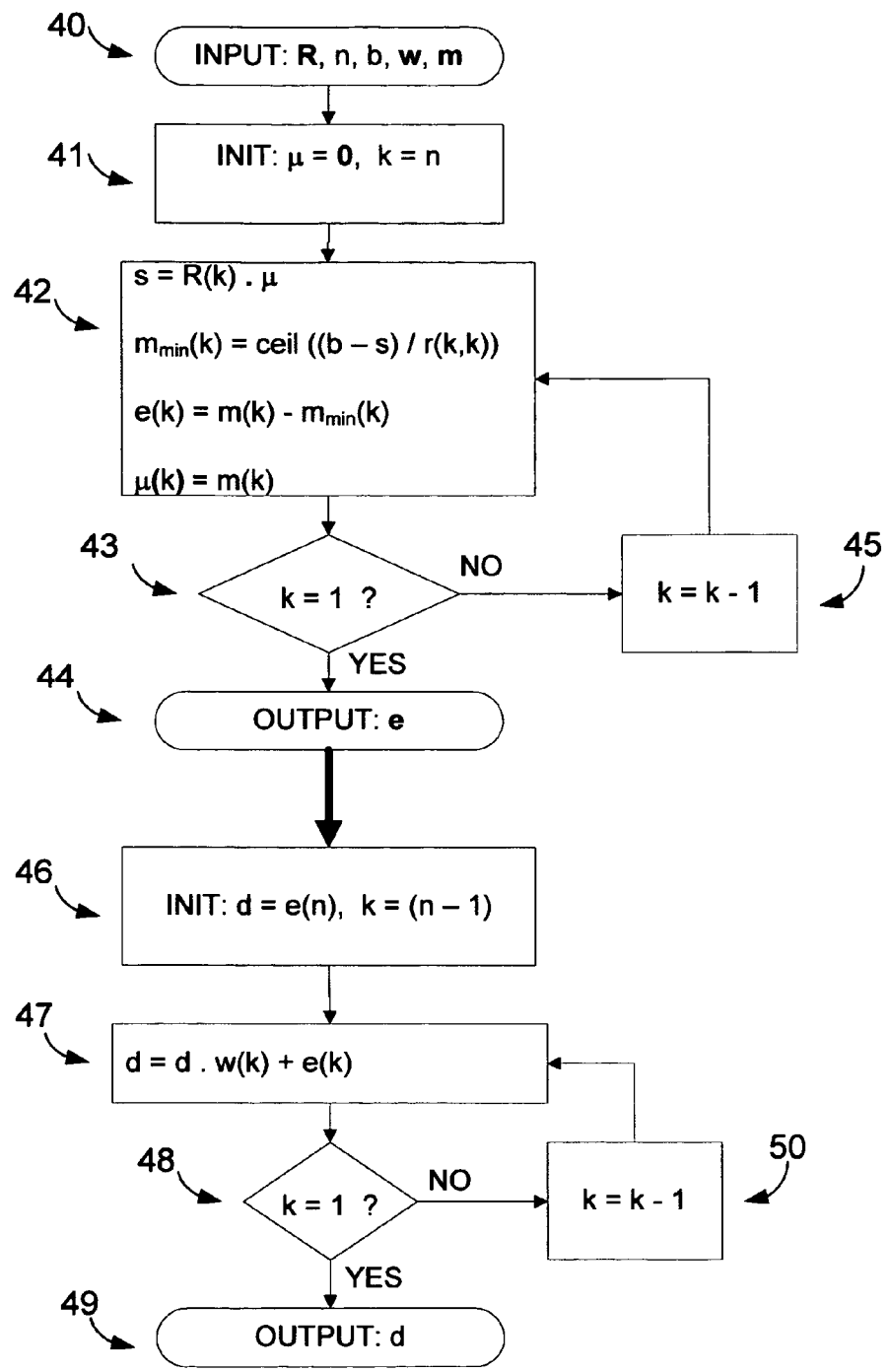
FIG. 4 describes the flowchart of a preferred embodiment of the proposed decoding method.

The proposed invention decoding method can be generalized and formalized as shown in the flowchart of FIG. 4, which is divided in two sections, the branch position vector e calculation, 40 to 45; and the information integer d calculation, 46 to 50, all of FIG. 4. Inputs to the decoding process, shown in 40 of FIG. 4, are the (say upper, w.l.o.g.) triangular generator matrix R of the lattice of choice; the number of cells n (dimension of R); the lowest physical variable value b; the pre-calculated (possibly mixed) radix vector w; and the to-be-decoded confined lattice point integer descriptor vector m. In 41 of FIG. 4 the auxiliary vector μ of dimension n and a loop index k are initialized. In 42 of FIG. 4 an auxiliary scalar s is calculated by means of the current value of μ and a selected row of R (denoted R(k)); this is followed by the calculation of $m_{min}$ (k) which consists of a simple generalization of (7d) above; the next element e(k) is then calculated and the auxiliary vector μ is updated (and used at next iteration). In 43 of FIG. 4 the iteration loop condition is tested. If not done yet, the iteration index k is decremented in 45 and 42 is repeated, otherwise the branch position vector e is ready in 44, all of FIG. 4.

Initialization of the result integer d and of the iteration index k takes place in 46. In 47 of FIG. 4 the integer d is updated using a recursion formula. The iteration loop condition is tested in 48; if not done yet, the iteration index k is decremented in 50 and 47 is repeated, otherwise the information integer d is ready in 49, all of FIG. 4. Upon the completion of the decoding process as detailed in FIG. 4 a lattice point, confined to an hyper-cubic region of $R^n$, is uniquely mapped into a bounded integer.

The encoding and decoding method described herein can be easily adapted, by those skilled in the art, to closed lattice regions of shapes other than hyper-cubic (which fit well the storage application), such as spheric regions (which may better fit communication applications), or other suitable chosen closed lattice region shapes. Regardless of the chosen closed region shape, while we have used storage as a main exemplary use of this invention, the encoding/decoding described problem and its proposed solution, as quoted above (i.e. [3]) and as should be readily understood by those skilled in the art, are equally and immediately applicable to data communication applications. In this latter, 'transmit' into a communication channel and 'receive' from a communication channel would be the equivalents of 'program' and 'read back', and the fore-mentioned physical variables could typically take the form of a constellation point set out by the amplitude and phase of some carrier.

In other preferred embodiments of the present invention, for some selected lattices, at some selected densities, it may occur that the components of the resultant mixed radix vector w are all integer powers of 2; such is the case for example at the $E_8$ lattice for the nominal 2 bpc density case (i.e. enhanced 2.5 bpc case) where $w(E_8)$=(4 4 4 4 8 8 8 8)=($2^2$ $2^2$ $2^2$ $2^2$ $2^3$ $2^3$ $2^3$ $2^3$) as presented above. In such cases the calculation (during lattice encoding) of e, the mixed radix representation of the bounded integer d, and the calculation (during lattice decoding) of the bounded integer d out of the mixed radix representation e as described in FIGS. 3 and 4 above, can be both replaced by simple component by component binary encoding (or decoding).

In such preferred embodiments, further elaborating on the for-mentioned $E_8$ lattice as way of example, the bounded integer d would be binary represented by up to 20 bits ($2^{20}$=1048576 as described above); we would then allocate (during encoding) 2 bits to each of the first components $w_1$ to $w_4$, and 3 bits to each of the next components $w_5$ to $w_8$, totaling 20 bits as required. The extension to other appropriate lattices, other appropriate densities, should be obvious to anyone skilled in these arts.

In accordance with this present invention an enhanced storage capacity memory device would comprise: means to encode a bounded integer into a corresponding confined lattice point, said means comprising arithmetic and logic operators able to transform integers into some (possibly mixed) radix representation and further comprising arithmetic and logic operators able to transform said representation into a confined lattice point or confined lattice point integer descriptor.

In accordance with this present invention an enhanced storage capacity memory device would further comprise: means to decode a confined lattice point back into its corresponding bounded integer, said means comprising arithmetic and logic operators able to transform a confined lattice point or confined lattice point integer descriptor into a (possibly mixed) radix representation and further comprising arithmetic and logic operators able to transform said representation into a bounded integer.

In further accordance with this present invention an enhanced storage capacity memory device would also comprise means to store essential invention parameters such as a triangular lattice generator matrix and pre-calculated radix vector, and means to sequence and control calculations such as those detailed in FIG. 3 and FIG. 4.

The significant storage capacity gain facilitated by this proposed invention may be applicable to different semiconductor memory technologies, such as but not limited to fore mentioned flash memory, and the so called RAM; to optical memory technologies such as, but not limited to CD and DVD; and to magnetic memory technologies such as, but not limited to HD. The proposed invention is also applicable to fore mentioned technologies with ability to store one or more bits per cell. Similarly, the proposed invention is applicable to wired and wireless communication technologies.

Figure 5:
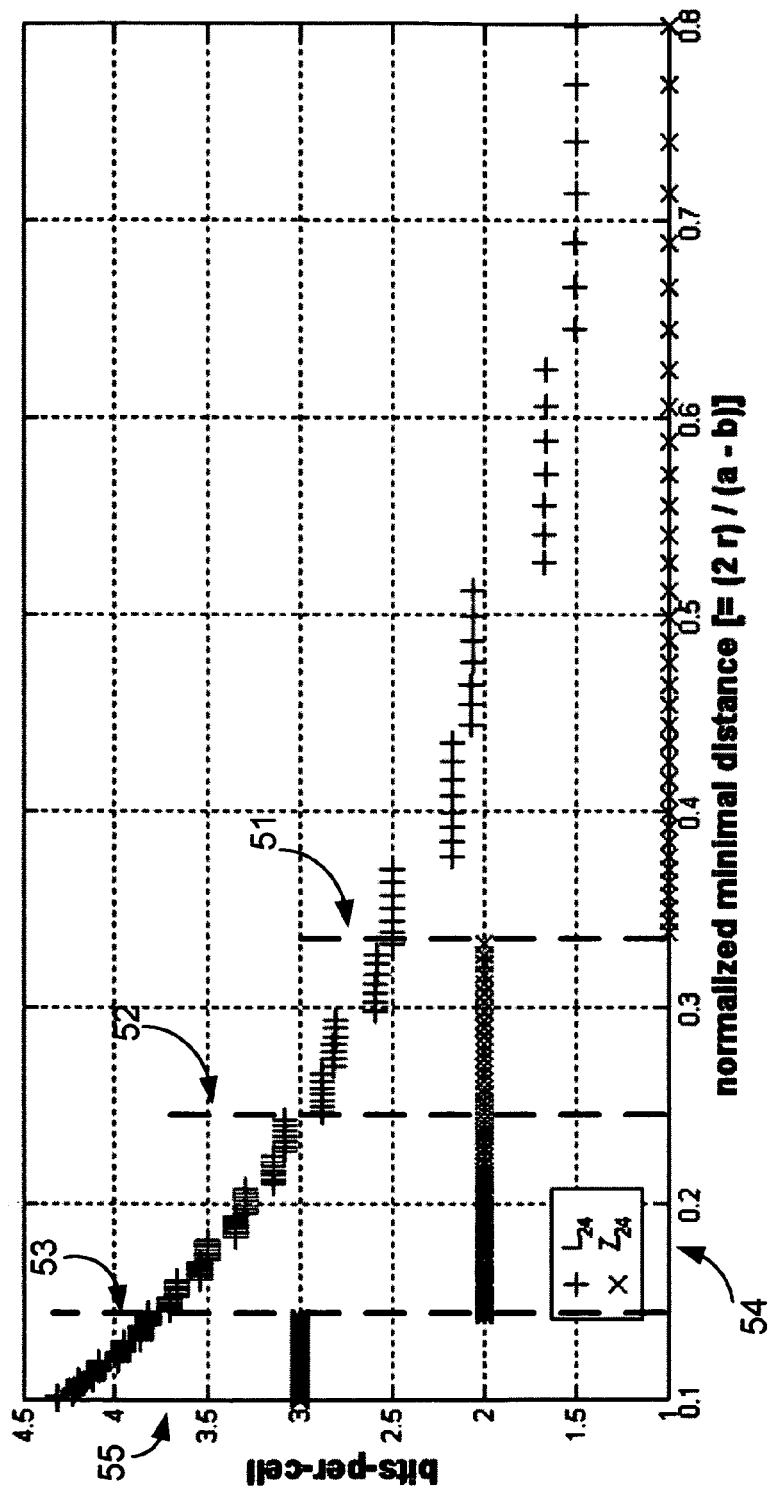
FIG. 5 demonstrates attainable storage density gains of a selected dense lattice as compared with the commonplace cubic integer lattice of same dimension.

FIG. 5 shows attainable storage capacity gains of a selected dense lattice, the Leech lattice $\Lambda_{24}$ in this case, as compared to the commonplace cubic lattice of same dimension, i.e. $Z_{24}$. As described above the reference $Z_{24}$ lattice represents the common so called Multi-Level-Cell (MLC) coding case whereby information is separately encoded in each cell. The shown capacity gains are actual (rather than theoretical) and include the fore mentioned 'lattice tilt' effect into account.

At each point along the horizontal axis 54 of FIG. 5, representing a selected normalized minimal distance between hyper-spheres (equivalent to normalized hyper-spheres radius) the storage capacity density (in bits-per-cell, bpc) was calculated for both lattices ('X' for $Z_{24}$, '+' for $\Lambda_{24}$) and shown along the vertical axes 55 of FIG. 5. For this purpose, the mixed radix vector w corresponding to these a, b and r was calculated, as described above, from which the number of the confined hyper-sphere centers and resulting density was immediately calculated. The stepwise nature of both density plots are obviously a result of the discrete nature of the lattice space.

In 51 of FIG. 5 it is shown that the same minimal distance (equal to 0.33 in this case) that results in 2 bpc in $Z_{24}$ yields 2.5 bpc at $\Lambda_{24}$, that is a 25% capacity gain. As mentioned above same minimal distance in two lattices are indicative of similar expected error probabilities (indicative—since in practice error probability depends on additional factors as well). In 52 of FIG. 5 it is shown that at minimal distance of 0.24 a density of 3.1 bpc is achieved, i.e. a gain larger than 50% relative to 2 bpc for $Z_{24}$ at same minimal distance. Finally it is shown in 53 of FIG. 5 that at the same minimal distance (=0.14) for which $Z_{24}$ achieves 3 bpc, a density of 3.8 bpc is achievable for $\Lambda_{24}$, i.e. a capacity gain of 26%.

As a final note to the possible applications of this invention it is noted that these same results can be conversely interpreted: $\Lambda_{24}$ achieves any given density (such as 3.1 bpc as shown by 52) at a considerably larger minimal distance (0.24) than that which is required for $Z_{24}$ in order to achieve similar 3 bpc density (0.14 as shown by 53) indicating the potential gain in error probability at similar density (other than the potential gain in density at similar error probability as so far described).

What is claimed is:

1. A method for encoding and decoding information on communication or memory devices, said method comprising:
    representing a bounded integer as a corresponding lattice point confined to a closed region of a multi-dimensional space having n dimensions;
    encoding said bounded integer into said device by setting said corresponding confined lattice point to a set of joint values of a characteristic physical variable;
    recovering said bounded integer from said device by:
    i) sensing said set of joint values of said characteristic physical variable;
    ii) detecting a corresponding confined lattice point from said set of sensed joint values; and
    iii) decoding said detected confined lattice point as a recovered bounded integer,
wherein said lattice is represented by a triangular matrix.

2. A method according to claim 1, wherein said lattice is brought to be represented by said triangular matrix.

3. A method according to claim 1, wherein said lattice is a-priori represented by said triangular matrix.

4. A method according to claim 1, wherein said triangular matrix comprises a generator matrix of said lattice.

5. A method according to claim 1, wherein said triangular matrix comprises an inverse of the generator matrix of said lattice.

6. A method in accordance with claim 1, wherein said confined lattice points are represented by a tree data structure, and all branches of any given layer of said tree are set to be of a same radix.

7. A method in accordance with claim 6, wherein said radixes of said tree layers are pre-calculated.

8. A method in accordance with claim 7, wherein said encoding comprises:
    converting said bounded integer into a corresponding radixes representation, and
    converting said corresponding radixes representation into said corresponding confined lattice point.

9. A method in accordance with claim 7, wherein said decoding said detected confined lattice point as said recovered bounded integer comprises:
    converting said detected confined lattice point into a radixes representation; and
    converting said radixes representation into said recovered bounded integer.

10. A method in accordance with claim 1, wherein said closed region is hyper-cubic.

11. A method in accordance with claim 1, wherein said closed region is an n-polytope.

12. A method in accordance with claim 1, wherein said closed region is hyper-spheric.

13. A method in accordance with claim 1, wherein said closed region is hyper-ellipsoid.

14. A method in accordance with claim 1, further comprising increasing the minimal distance between neighbor lattice points beyond the minimal distance achieved by lattice points contained in a closed region of a same volume and containing a same number of lattice points, said closed region being encoded by a cubic lattice, thus achieving an error probability gain.

15. A method in accordance with claim 1, further comprising increasing the number of lattice points beyond the number of lattice points contained in a closed region of a same volume and encoded by a cubic lattice with same minimal distance, thus achieving density gain.

16. A method in accordance with claim 1, further comprising increasing the minimal distance and the number of lattice points beyond those achieved by lattice points contained in a closed region of a same volume and encoded by a cubic lattice, thus achieving both error probability gain and density gain.

17. A method in accordance with claim 1 where said device comprises one of: a wireless communication device and a wired communication device.

18. A method in accordance with claim 1, wherein said device comprises one of: a flash memory device, a semiconductor memory device, an optical media memory device, and a magnetic media memory device.

19. A method in accordance with claim 1, wherein said lattice is $E_8$.

20. A method in accordance with claim 1, wherein said lattice is $\Lambda_{24}$.

21. A method in accordance with claim 1, wherein said lattice is one of: $K_{12}$, $\Lambda_{16}$, $P_{48}$, $N_{e64}$, $MW_{80}$, and $MW_{128}$.

22. A method in accordance with claim 1, where said lattice is any lattice.

23. A communication or memory device for encoding a bounded integer into a corresponding confined lattice point, comprising:
    arithmetic and logic operators operable to transform bounded integers into corresponding radix representations; and
    arithmetic and logic operators operable to transform, utilizing a triangular matrix, said radix representations into a confined lattice point or into an integer descriptor of said confined lattice point.

24. A communication or memory device in accordance with claim 23, further comprising decoding a confined lattice point back into said corresponding bounded integer, comprising:
- arithmetic and logic operators operable to transform, utilizing said triangular matrix, a confined lattice point or confined lattice point integer descriptor into a radix representation; and
- arithmetic and logic operators operable to transform said radix representations into a bounded integer.

25. A communication or memory device in accordance with claim 23 further comprising:
- a memory element configured to store essential invention parameters comprising at least one of: a triangular matrix, a triangular generator matrix, a triangular inverse of said generator matrix, and a pre-calculated radix vector; and
- arithmetic and logic operators operable to sequence and control arithmetic and logic calculations.

26. A communication or memory device in accordance with claim 23, wherein the radixes in said radix representation are mixed.

27. A communication or memory device in accordance with claim 23, wherein the radixes in said radix representation are equal.

28. A communication or memory device in accordance with claim 23, wherein said triangular matrix comprises a generator matrix of said lattice.

29. A communication or memory device in accordance with claim 23, wherein said triangular matrix comprises an inverse generator matrix of said lattice.

* * * * *